(12) United States Patent  
Inao et al.

(10) Patent No.: US 7,740,992 B2  
(45) Date of Patent: Jun. 22, 2010

(54) EXPOSURE APPARATUS, EXPOSURE METHOD, AND EXPOSURE MASK

(75) Inventors: Yasuhisa Inao, Tokyo (JP); Ryo Kuroda, Kawasaki (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 541 days.

(21) Appl. No.: 10/554,993

(22) PCT Filed: Jun. 24, 2005

(86) PCT No.: PCT/JP2005/012166

§ 371 (c)(1), (2), (4) Date: Nov. 30, 2006

(87) PCT Pub. No.: WO2006/001520

PCT Pub. Date: Jan. 5, 2006

(65) Prior Publication Data

US 2007/0146680 A1     Jun. 28, 2007

(30) Foreign Application Priority Data

Jun. 29, 2004   (JP) .............................. 2004-191805

(51) Int. Cl.
*G03F 1/00* (2006.01)

(52) U.S. Cl. ............................................. 430/5; 355/73
(58) Field of Classification Search .................. 355/73; 324/662; 430/5

See application file for complete search history.

(56) References Cited

U.S. PATENT DOCUMENTS 4,397,078 A * 8/1983 Imahashi .................... 324/662
4,669,868 A   6/1987 Chapelle et al. ............... 355/53
5,508,527 A   4/1996 Kuroda et al. ............. 250/491.1

(Continued)

FOREIGN PATENT DOCUMENTS

EP    1 150 162 A2    10/2001

(Continued)

OTHER PUBLICATIONS

Communication pursuant to Article 94(3) EPC, mailed in a Communication dated Jan. 12, 2009, in copending European patent application No. 05 755 684.7.

(Continued)

*Primary Examiner*—Mark F Huff
*Assistant Examiner*—Rashid Alam
(74) *Attorney, Agent, or Firm*—Fitzpatrick, Cella, Harper & Scinto

(57) ABSTRACT

An exposure apparatus to be used with an exposure mask having an elastically deformable holding member and a light blocking film provided on the holding member and being formed with an opening pattern. For exposure, the mask is flexed, to be brought into contact with an object to be exposed. The apparatus includes a distance detecting device for detecting a distance between the exposure mask and the object to be exposed. The distance detecting device is adapted to detect the distance between the exposure mask and the object to be exposed before the exposure mask is flexed. The apparatus also includes a distance controlling device for controlling the distance between the exposure mask before the mask is flexed and the object to be exposed, on the basis of a signal from the distance detecting device.

1 Claim, 5 Drawing Sheets

U.S. PATENT DOCUMENTS

| | | | |
|---|---|---|---|
| 5,737,064 A * | 4/1998 | Inoue et al. | 355/73 |
| 6,171,730 B1 | 1/2001 | Kuroda et al. | 430/5 |
| 6,187,482 B1 | 2/2001 | Kuroda et al. | 430/5 |
| 6,559,926 B2 | 5/2003 | Yamaguchi et al. | 355/53 |
| 6,628,392 B2 | 9/2003 | Kuroda et al. | 356/400 |
| 6,632,593 B2 | 10/2003 | Yamaguchi et al. | 430/322 |
| 6,720,115 B2 | 4/2004 | Inao et al. | 430/5 |
| 7,001,696 B2 | 2/2006 | Inao et al. | 430/5 |
| 7,050,144 B2 | 5/2006 | Mizutani et al. | 355/19 |
| 7,068,353 B2 | 6/2006 | Yano et al. | 355/67 |
| 7,136,145 B2 | 11/2006 | Yamaguchi et al. | 355/53 |
| 7,144,682 B2 | 12/2006 | Inao et al. | 430/311 |
| 7,144,685 B2 | 12/2006 | Mizutani et al. | 430/311 |
| 2004/0023161 A1 | 2/2004 | Yamaguchi et al. | 430/311 |
| 2004/0080732 A1 | 4/2004 | Kuroda et al. | 355/53 |
| 2004/0166421 A1 | 8/2004 | Yamaguchi et al. | 430/5 |
| 2004/0223142 A1 | 11/2004 | Inao et al. | 356/237.1 |
| 2005/0057752 A1 | 3/2005 | Inao et al. | 356/400 |
| 2005/0063445 A1 | 3/2005 | Mizutani et al. | 372/94 |
| 2005/0064301 A1 | 3/2005 | Yamaguchi et al. | 430/5 |
| 2005/0064303 A1 | 3/2005 | Yamada et al. | 430/5 |
| 2006/0003233 A1 | 1/2006 | Yamaguchi et al. | 430/5 |
| 2006/0003236 A1 | 1/2006 | Mizutani et al. | 430/5 |
| 2006/0003269 A1 | 1/2006 | Ito et al. | 430/323 |
| 2006/0007440 A1 | 1/2006 | Kuroda et al. | 356/400 |
| 2006/0110693 A1 | 5/2006 | Kuroda et al. | 430/394 |
| 2006/0124834 A1 | 6/2006 | Mizutani et al. | 250/216 |
| 2006/0152703 A1 | 7/2006 | Yamaguchi et al. | 355/77 |
| 2006/0160036 A1 | 7/2006 | Mizutani | 430/396 |

FOREIGN PATENT DOCUMENTS

| | | |
|---|---|---|
| JP | 2001-31987 | 2/2001 |
| JP | 2001-308002 | 11/2001 |
| JP | 2001-319875 | 11/2001 |
| JP | 2002-231614 | 8/2002 |
| JP | 2002-231615 | 8/2002 |
| JP | 2004-335752 | 11/2004 |
| JP | 2005-101135 | 4/2005 |

OTHER PUBLICATIONS

Supplementary European Search Report dated Jun. 17, 2008, mailed in a Communication dated Jun. 26, 2008, in copending European patent application No. 05 75 5684.

Chinese Office Action dated Jun. 27, 2008, issued in corresponding Chinese patent application No. 2005-800217559, with English translation.

International Search Report dated Sep. 16, 2005, which was mailed in a Communication dated Oct. 4, 2005, and which issued in corresponding International Application No. PCT/JP2005/012166.

Written Opinion of the International Searching Authority mailed Oct. 4, 2005, issued in International Application No. PCT/JP2005/012166.

Korean Office Action dated Nov. 22, 2007, issued in corresponding Korean patent application No. 10-2006-7027503.

* cited by examiner

EXPOSURE APPARATUS, EXPOSURE METHOD, AND EXPOSURE MASK

This application claims the benefit of International Application No. PCT/JP2005/012166, filed Jun. 24, 2005, and Japanese Patent Application No. 2004-191805, filed Jun. 29, 2004, both which are hereby incorporated by reference herein in their entirety.

TECHNICAL FIELD

This invention relates to an exposure apparatus, an exposure method, and an exposure mask. More particularly, the invention concerns technologies for lithographic exposure based on near-field light.

BACKGROUND ART

The lithographic technologies have been advanced and diversified, and novel lithographic methods have been proposed as emerging lithographic technologies. An example is a lithographic exposure method using near-field light that enables ultra-fine processing beyond the diffraction limit of light.

U.S. Pat. No. 6,171,730 proposes an exposure apparatus based on an exposure method using near-field light, wherein an exposure mask is made of a resilient material and wherein, by elastically deforming the mask to follow the surface shape of a resist, the whole surface of the exposure mask is brought into intimate contact with the resist surface, whereby exposure using near-field light is carried out.

In the exposure apparatus and exposure method disclosed in the aforementioned U.S. patent, first, the exposure mask and the object to be exposed are brought close to each other up to a predetermined distance and then, the exposure mask is elastically deformed (flexed) to bring the exposure mask and the object to be exposed into contact with each other. In such a structure, however, if the distance between the exposure mask and the object to be exposed deviates from the predetermined distance, the amount of extension of the exposure mask to be elastically deformed would change, and it would cause a change in the size or spacing of a pattern to be transferred to the object to be exposed. Such a problem has never been considered in the near-field exposure technologies.

DISCLOSURE OF THE INVENTION

It is, accordingly, an object of the present invention to provide an improved exposure apparatus and/or an improved exposure method, based on near-field light.

In accordance with one aspect, the present invention provides an exposure apparatus to be used with an exposure mask having an electrically deformable holding member and a light blocking film provided on the holding member, and being formed with an opening pattern, wherein for exposure, the exposure mask is flexed to be brought into contact with an object to be exposed. The apparatus comprises a distance detecting means for detecting a distance between the exposure mask before being flexed and the object to be exposed, and distance controlling means for controlling the distance between the exposure mask, before being flexed, and the object to be exposed, on the basis of a signal from the distance detecting means.

In accordance with another aspect, the present invention provides an exposure method wherein, for exposure, an exposure mask, having an elastically deformable holding member and a light blocking film provided on the holding member and being formed with an opening pattern, is flexed, to be brought into contact with an object to be exposed. The method comprises the steps of detecting a distance between the exposure mask and the object to be exposed, before the exposure, and controlling the distance between the exposure mask and the object to be exposed, to control the amount of flexure of the exposure mask.

In accordance with a further aspect of the present invention, an exposure mask comprises an elastically deformable holding member, a light blocking film provided on the holding member and having an opening pattern, and a member serviceable for detection of a distance between an exposure mask and an object to be exposed, by use of the exposure mask.

Briefly, in accordance with the present invention, the distance between an exposure mask, before it is flexed, and an object to be exposed is detected, and, on the basis of the detection, the distance between the exposure mask, before the exposure mask is flexed, and the object to be exposed, is controlled. With this procedure, the amount of flexure of the exposure mask can be controlled precisely and, therefore, the size of a spacing of a pattern to be transferred to the object to be exposed can be controlled very accurately.

These and other objects, features and advantages of the present invention will become more apparent upon a consideration of the following description of the preferred embodiments of the present invention, taken in conjunction with the accompanying drawings.

BEST MODE FOR PRACTICING THE INVENTION

Preferred embodiments of the present invention will now be described with reference to the attached drawings.

Figure 1:
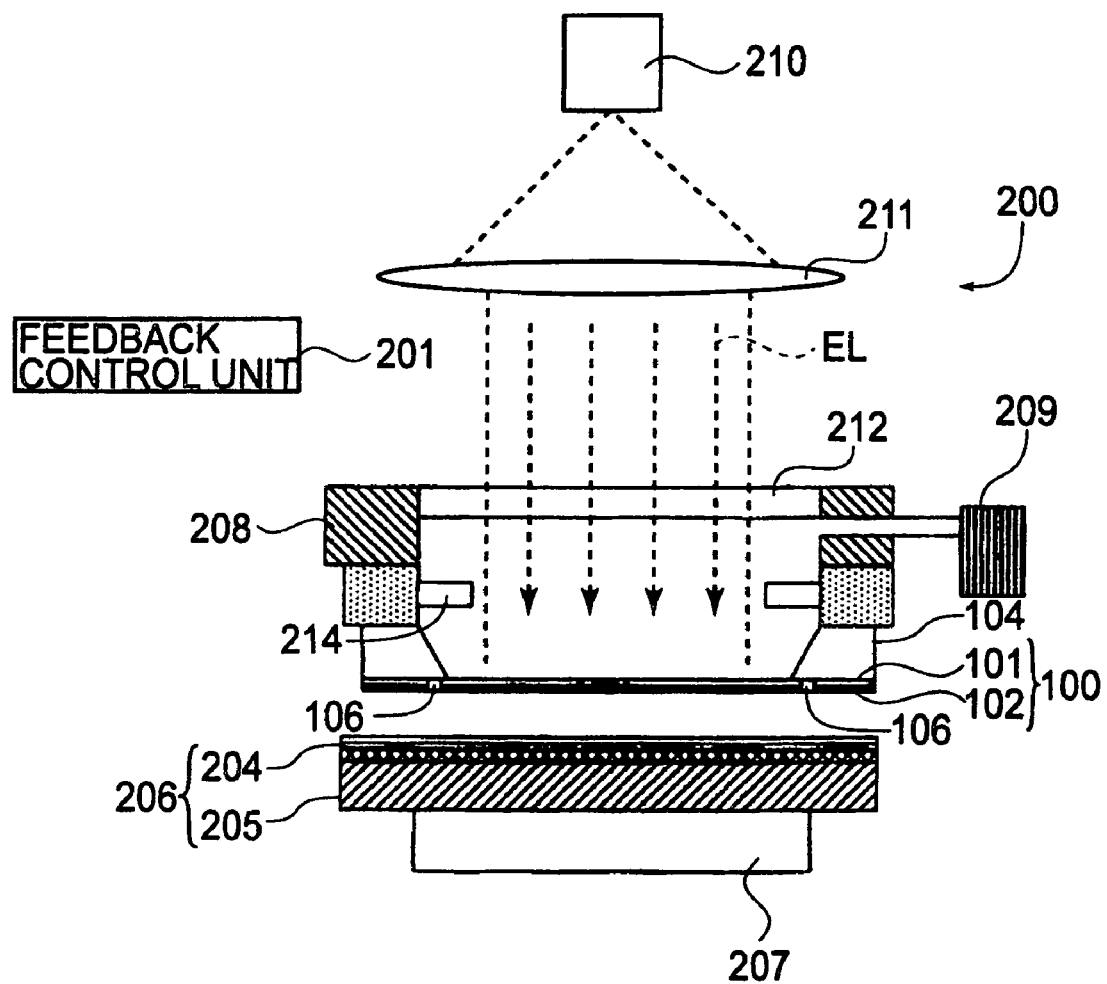
FIG. 1 is a schematic view of a general structure of an exposure apparatus according to a first embodiment of the present invention.

FIG. 1 is a schematic view of a general structure of an exposure apparatus according to a first embodiment of the present invention. In FIG. 1, denoted at 200 is a near-field exposure apparatus that comprises a pressure adjusting container 208, an exposure light source 210, and a pressure adjusting device 209 for adjusting the pressure inside the pressure adjusting container 208.

Figure 2A:
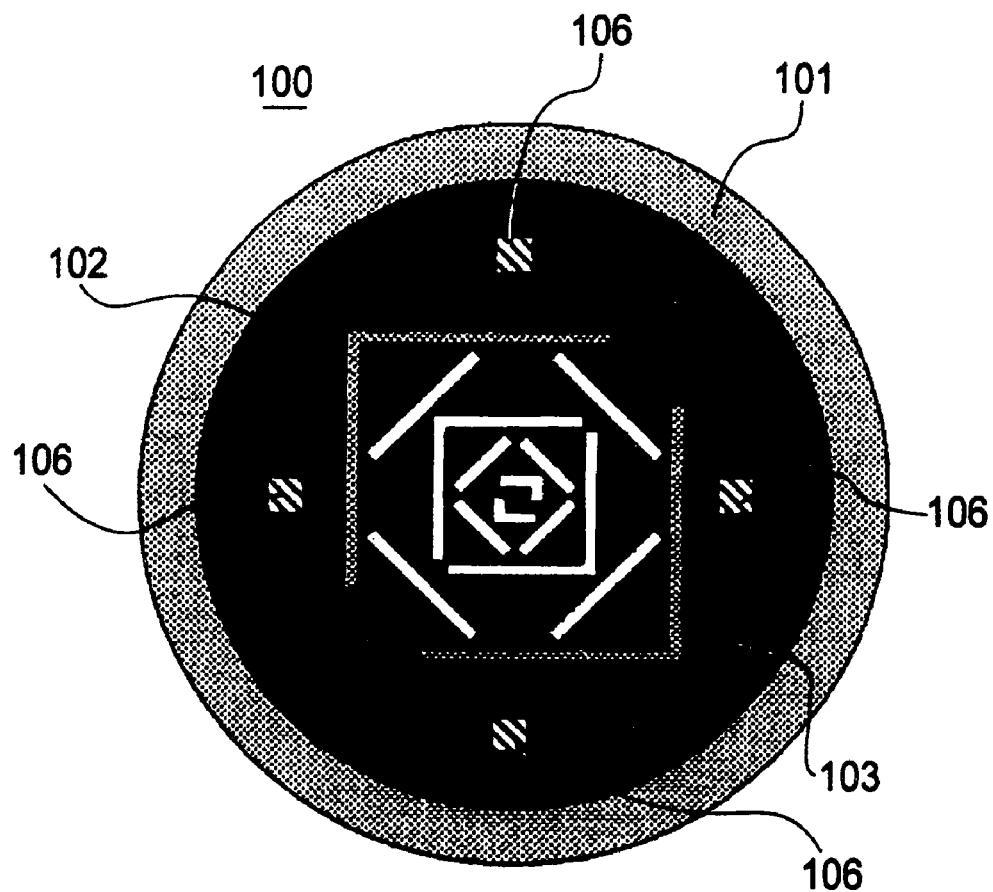
FIGS. 2A and 2B are a plan view and a sectional view, respectively, for explaining an exposure mask that can be used in the exposure apparatus of FIG. 1.
Figure 2B:
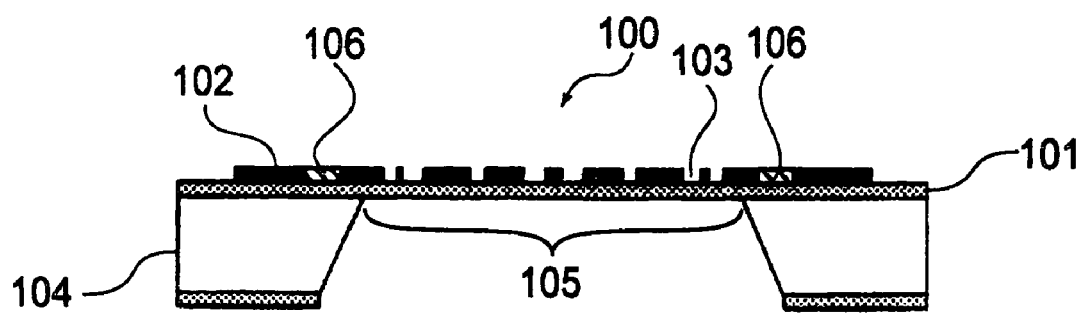

Denoted at 100 in FIG. 1 is an exposure mask, which is attached to the bottom of the pressure adjusting container 208. As best seen in FIGS. 2A and 2B, this exposure mask 100 comprises a mask supporting member 104, a mask base material 101 and a light blocking film 102. The light blocking film 102 is formed to be held by the mask base material 101, which is a thin-film holding member made of an elastic (resilient) material. The light blocking film 102 has fine openings 103 formed in a desired pattern.

At least a central portion of the exposure mask 100, off the mask supporting member 104, provides an elastically deformable thin film portion 105. Hereafter, the surface of the exposure mask 100, shown in FIG. 2A, that is, the surface on which the light blocking film 102 is provided, will be referred to as a "front surface" and the surface on the other side will be referred to as a "back surface". The exposure mask 100 is attached to the bottom of the pressure adjusting container 208 through the mask supporting member 104.

Denoted at 206 in FIG. 1 is a workpiece to be exposed, being mounted on a stage 207, which is movable means that can be moved two-dimensionally along the mask surface and, also, in a direction of a normal to the mask surface. The workpiece 206 to be exposed comprises a substrate 205 and a resist 204 formed on the surface of the substrate 205. The workpiece 206 is placed on the stage 207 and, after that, by moving the stage 207, relative positional alignment of the substrate 205 with the exposure mask 100, with respect to the two-dimensional directions along the mask surface, is achieved. Thereafter, the workpiece is moved in the direction of a normal to the mask surface.

Denoted at 211 in FIG. 1 is a collimator lens that functions to transform exposure light EL emitted from an exposure light source 210 into parallel light. The exposure light being transformed into parallel light by the collimator lens 211 passes through a glass window 212 formed on the top of the pressure adjusting container 208, and it enters the pressure adjusting container 208.

Next, an exposure method to be carried out in the near-field exposure apparatus 200, having a structure such as described above, will be explained.

First of all, the exposure mask 100 is attached to the bottom of the pressure adjusting container 208, with its front surface facing the workpiece 206 to be exposed. Subsequently, the workpiece 206 is placed on the stage 207 and, by moving the stage 207, relative alignment of the workpiece with the exposure mask 100, with respect to the two-dimensional directions along the mask surface, is carried out. Thereafter, the workpiece 206 is moved in the direction of a normal to the mask surface, until the distance therefrom to the exposure mask 100 becomes equal to a certain preset distance.

Subsequently, a gas is supplied into the pressure adjusting container 208 from the pressure adjusting means 209, and a pressure is applied to the exposure mask 100 from the back surface thereof to the front surface thereof. The pressure is applied to cause elastic deformation (flexure) of the exposure mask 100 (thin film portion 105 thereof) toward the workpiece side, to bring the exposure mask 100 into contact (intimate contact) with the workpiece 206, so that the clearance between the surface of the exposure mask 100 and the surface of the resist 204 on the substrate 205 is kept equal to 100 nm or less, throughout the whole mask surface.

Subsequently, after the exposure mask 100 is brought into intimate contact with the workpiece 206, exposure light EL, emitted from the exposure light source 210 and transformed into parallel light by the collimator lens 211, is projected into the pressure adjusting container 208 through the glass window 212, to illuminate the exposure mask 100 from its back surface. In response, near-field light leaks or escapes from the fine-opening pattern, which is formed in the light blocking film 102, on the mask base material 101 of the exposure mask 100, such that, on the basis of the near-field light, exposure of the workpiece 206 is carried out.

Subsequently, after the exposure process such as described above is completed, the gas inside the pressure adjusting container 208 is discharged outwardly, so that the same pressure as the outside pressure is produced inside the container. In response, the flexure of the exposure mask 100 is released, and thus, the exposure mask 100 disengages from the workpiece 206. If there is any attraction force present between the exposure mask 100 and the workpiece 206, the exposure mask 100 may not disengage from the workpiece 206, even though the inside pressure of the pressure adjusting container is made equal to the outside pressure thereof. In such a case, the pressure inside the pressure adjusting container may be made lower than the outside pressure, to cause upward flexure of the exposure mask, as viewed in the drawing, to thereby strengthen the force of disengagement.

With the procedure described above, the exposure process is completed, and a desired pattern can be transferred to the workpiece 206. In this embodiment, a pressure application method is used to apply a pressure to the exposure mask 100, to cause flexure of the same. In place of this, an electrostatic force may be provided between the exposure mask 100 and the workpiece 206, to cause flexure of the exposure mask 100 toward the workpiece 206. Anyway, the present invention is not limited to a particular method in regard to producing mask flexure.

Figure 3:
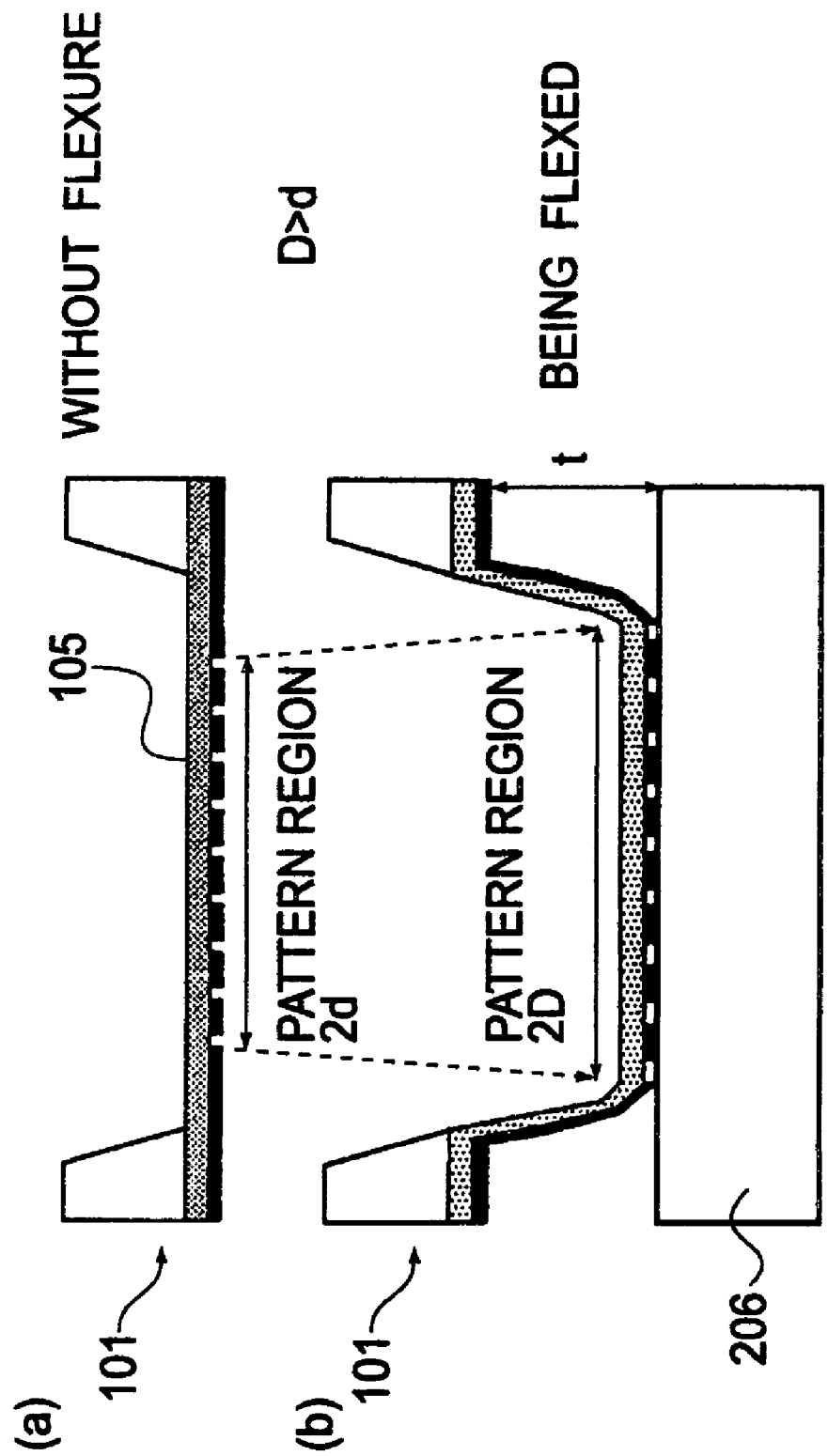
FIG. 3 is a schematic view for explaining flexure and expansion of an exposure mask, as well as a resultant pattern extension and positional deviation.

In the near-field exposure apparatus 200 of this embodiment using near-field light, when the exposure mask 100 is brought into intimate contact with the workpiece 206, the exposure mask itself is flexed. Here, since the exposure mask itself is made of an elastic (resilient) material, flexure of the mask causes extension of the mask 100 (particularly, the thin film portion 105 thereof). This causes expansion of the exposure mask 100, such as shown in FIG. 3: that is, an unexpanded pattern region 2d of the mask 100 (shown in part (a) of FIG. 3) would be expanded to an expanded pattern region 2D (shown in part (b) of FIG. 3). As a result, the size or position of the fine-opening pattern would be expanded.

As regards the amount of extension of the exposure mask described above, if the exposure mask 100 has a circular shape, such as shown in FIG. 2, and when the radius thereof is d, the amount of displacement of the exposure mask center is t, and the shape of an arcuate shape defined by the exposure mask 100 is taken as being approximated by a straight line, then the radius length D of the exposure mask after being expanded can be approximately given by $D=d/[\cos(t/d)]$.

In consideration of this, when the fine opening pattern of the exposure mask 100 is designed, in accordance with the design value of the clearance between the exposure mask and the workpiece 206, the amount of extension of the exposure mask 100 is determined beforehand by experiments, or numerical calculations for elastic deformation of a thin film. Then, the fine opening pattern of the exposure mask is designed with a correction taking into account the amount of extension thus determined.

If, for example, the set value of the clearance (distance) between the exposure mask 100 and the workpiece 206 to be exposed is 100 µm, and when the fine opening pattern of the exposure mask is expandable by 1.001 times, the mask may be designed with a correction in which the fine opening pattern produced on the exposure mask is being reduced by 0.999 ($\approx 1/1.001$) times.

If the shape of the thin-film-like mask base material 101, supported by the mask supporting member 104 as viewed form the normal direction, is circular, the exposure mask is expandable isotropically along the mask surface. In this case, therefore, correction of the general shape is unnecessary. If, on the other hand, the shape of the mask base material 101, as viewed in the direction of a normal, is rectangular, the mask is expandable anisotropically, similar to a spindle shape along the mask surface. Thus, in this case, the general layout of the opening pattern should be corrected beforehand into a spindle-like disposition.

However, even when an exposure mask 100, with an opening pattern having been designed such as described above, is used, if, in the exposure process, the clearance (distance) between the exposure mask before it is flexed and a workpiece 206 to be exposed differs from a preset distance, the amount of expansion of the exposure mask 100 also changes.

If, for example, the mask-to-workpiece distance becomes smaller than a set distance, the amount of flexure of the mask becomes smaller than the set amount of flexure. On the other hand, if the mask-to-workpiece distance becomes larger than a set distance, the amount of flexure of the mask becomes larger than the set amount of flexure.

If the amount of flexure (expansion) of the exposure mask changes in dependence upon the mask-to-workpiece distance, it causes a similar change in the size and spacing of the pattern to be transferred to the workpiece and, consequently, it leads to a failure of desired exposure.

In order to increase the precision of the size and spacing of a pattern to be transferred, the mask-to-workpiece distance must be controlled precisely. Also, to this end, the mask-to-workpiece distance has to be measured precisely.

In this embodiment, in consideration of this, as shown in FIG. 1, there is a distance measuring device 214, which is provided inside the pressure adjusting container 208, as distance detecting means.

The distance measuring device 214 has a structure for measuring the distance on the basis of triangulation measurement using a laser beam, for example. In association with this, as shown in FIG. 2, there are transparent regions 106 formed in the exposure mask 100 and at positions corresponding to the distance measuring device 214. The transparent regions 106 each comprises a light transmitting window and provides a reference point for the distance measurement.

In the near-field exposure apparatus of this embodiment, prior to carrying out the exposure process described above, the distance between the exposure mask 100 and the workpiece 206 to be exposed is measured by use of the distance measuring device 214. Then, the stage 207 is driven through a feedback control using a signal from the distance measuring device, such that the workpiece 206 to be exposed can be brought closely to the exposure mask 100 with a preset clearance, very precisely.

Next, the distance measuring operation of the distance measuring device 214 will be explained.

In the distance measuring device 214, for measurement of the distance, first of all, a laser beam is projected toward each transparent region 106 of the exposure mask 100. The laser beam thus projected is divided into a component reflected by the transparent region 106 and a component passing through the transparent region 106. The reflected component of the laser beam enters the distance measuring device 214. On the basis of the position of the reflection light thus incident, the distance to the transparent region 106, that is, the distance to the exposure mask 100, can be measured.

On the other hand, the transmitted component of the laser beam passing through the transparent region 106 thereafter reaches the workpiece 206 to be exposed, and it is reflected thereby. The thus reflected laser beam again passes through the transparent region 106 and then, it enters the distance measuring device 214. On the basis of the position of the reflection light being incident, the distance to the workpiece 206 to be exposed can be measured.

By taking a difference between the distance to the exposure mask 100 and the distance to the workpiece 206 to be exposed, having been measured respectively as described above, the distance between the exposure mask 100 and the workpiece 206 can be detected.

On the basis of the distance thus detected, feedback control of the stage 207 is carried out by use of a feedback control unit (distance controlling means) 201 provided at a predetermined position inside the near-field exposure apparatus 200. With this control, the distance between the exposure mask 100 and the workpiece 206 to be exposed can be controlled very precisely, and it can be held at a desired set value.

Regarding the transparent region 106 that can function as a reference point for measurement of the distance between the exposure mask 100 and the workpiece 206, a plurality of such transparent regions may be placed on the mask surface and, in this embodiment, as shown in FIG. 2, they are provided at four locations. This enables more accurate distance measurement. Additionally, four transparent regions 106 may be disposed uniformly and, on that occasion, any relative tilt between the exposure mask 100 and the workpiece 206 can be measured.

Any relative tilt between the exposure mask 100 and the workpiece 206 thus measured can be corrected by using the stage 207, such that the exposure mask 100 and the workpiece 206 to be exposed can be held exactly in parallel to each other. By performing exposure of the workpiece based on near-field light, after the tilt correction, the pattern exposure precision is improved significantly.

As regards the position where the transparent region 106 is to be formed, the thin film portion 105 has a possibility of being flexed during the distance measurement and, if it occurs, it obstructs correct distance measurement. In consideration of this, in order to assure correct measurement of the distance between the exposure mask 100 and the workpiece 206, the position of the transparent region 106 should desirably be defined upon the non-flexing mask supporting member.

By detecting the distance between the exposure mask 100 before it is flexed and the workpiece 206 to be exposed, and then, by controlling the distance between the exposure mask 100 before it is flexed and the workpiece 206 to be exposed, as described above, the amount of flexure of the exposure mask 100 can be controlled. Thus, the size, spacing, etc., of the pattern to be transferred to the workpiece 206 can be controlled.

In this embodiment, the distance measuring device 214 is based on triangulation measurement for the distance measurement. However, it may be based on other optical distance measuring methods such as, for example, a method of detecting distance on the basis of a focus position of an optical system, and a method using interference of light.

As a further alternative, in place of an optical distance measuring method, the distance measurement may be carried out by measuring an electrostatic capacity between an exposure mask and a workpiece to be exposed.

Next, a second embodiment of the present invention, which uses a distance measuring method based on electrostatic capacity measurement, will be explained.

Figure 4:
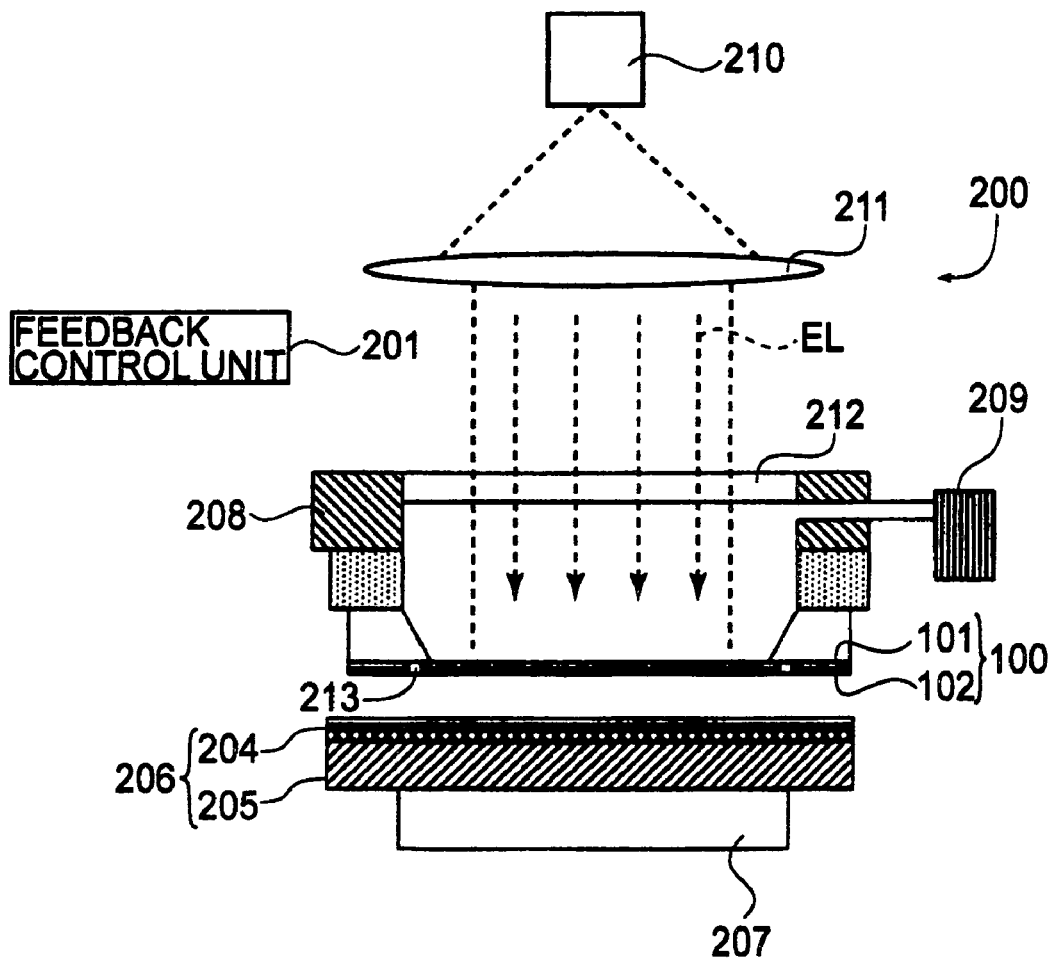
FIG. 4 is a schematic view of a general structure of an exposure apparatus according to a second embodiment of the present invention.

FIG. 4 is a schematic view of a general structure of an exposure apparatus according to the second embodiment of the present invention. In FIG. 4, components the same as or corresponding to those of FIG. 1 are denoted by like numerals.

Denoted at 213 in FIG. 4 are electrode pads, which are provided in the exposure mask 100, for measurement of electrostatic capacity. Between each electrode pad and the workpiece 206 to be exposed, there is a driving circuit (not shown) connected.

In this embodiment, prior to carrying out the exposure process as described hereinbefore, a voltage value outputted from the driving circuit is detected by means of a detection unit (not shown) and, on the basis of this voltage value, the electrostatic capacity is detected. In this embodiment, the electrode pads 213, the driving circuit (not shown) and the detecting unit (not shown) constitute the distance detecting means.

Here, since the electrostatic capacity is in accordance with the distance between the exposure mask 100 and the workpiece 206 to be exposed, by detecting the electrostatic capacitance, the distance between the exposure mask 100 and the workpiece 206 can be measured.

Then, on the basis of the thus measured distance, feedback control of the stage 207 is carried out by means of the feedback control unit 201, whereby the distance between the exposure mask 100 and the workpiece 206 can be controlled precisely at a desired value.

Figure 5A:
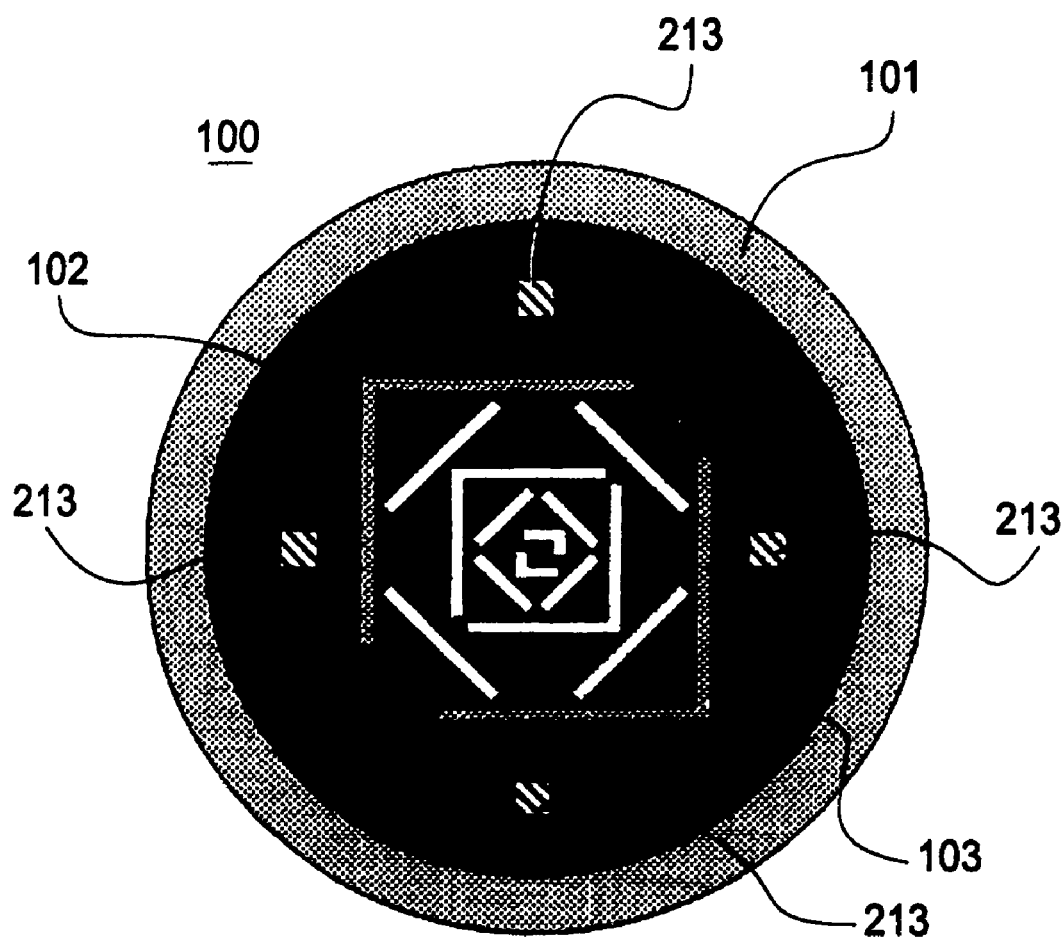
FIGS. 5A and 5B are a plan view and a sectional view, respectively, for explaining an exposure mask that can be used in the exposure apparatus of FIG. 4.
Figure 5B:
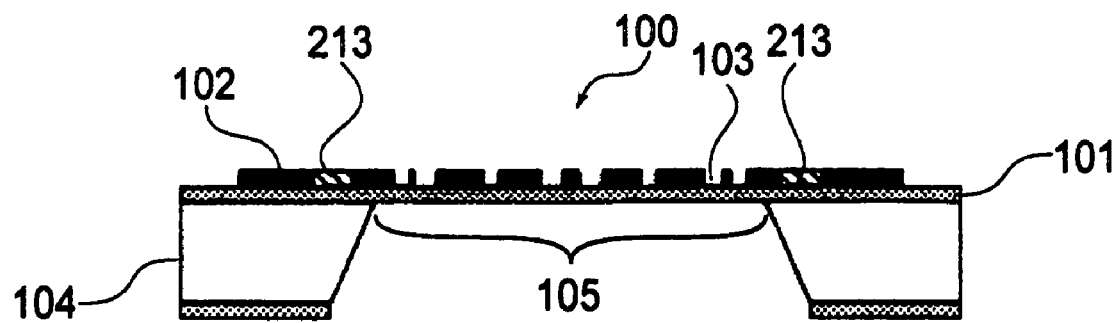

Regarding the electrode pad 213 that can function as a reference point for measurement of the distance between the exposure mask 100 and the workpiece 206, a plurality of such electrode pads may be placed on the mask surface and, in this embodiment, as shown in FIG. 5, they are provided at four locations. This enables more accurate distance measurement. Additionally, as in the first embodiment, four electrode pads 213 may be disposed uniformly and, on that occasion, any relative tilt between the exposure mask 100 and the workpiece 206 can be measured.

As regards the position where the electrode pad 213 is to be formed, the thin film portion 105 has a possibility of being flexed during the distance measurement and, if it occurs, it obstructs correct distance measurement. In consideration of this, in order to assure correct measurement of the distance between the exposure mask 100 and the workpiece 206, the position of the electrode pad 213 should desirably be defined upon the non-flexing mask supporting member.

In the foregoing two examples, the distance between the exposure mask 100 and the workpiece 206 to be exposed is measured optically, or on the basis of electrostatic capacitance. However, the present invention is not limited to these methods, with regard to the distance measurement. Any measuring method may be used, provided that the distance between an exposure mask and an object to be exposed can be measured thereby.

In accordance with the present invention, as has been described with reference to the first and second embodiments, the distance between the exposure mask 100 and a workpiece 206 to be exposed is measured and then, on the basis of the measurement, the distance between the exposure mask 100 and the workpiece 206 to be exposed is controlled exactly to be at a desired value. This procedure provides the ability to produce flexure of the exposure mask 100 exactly, by a preset amount. It should be noted, however, that the present invention is not limited to this. Namely, in the present invention, the distance between the exposure mask 100 and the workpiece 206 to be exposed may be controlled as desired, so as to cause flexure of the exposure mask by any desired amount.

For example, there are cases wherein, when a workpiece is going to be exposed by use of a certain exposure mask having an opening pattern formed thereon, due to a process factor, such as a production error of the fine-opening pattern, separate from the exposure process, a desired size or spacing of the fine-opening pattern is not attainable with the mask-to-workpiece distance determined as the fine-opening pattern was designed.

If the production error of the fine openings upon the exposure mask is really the cause, it would be necessary to correct the exposure mask or to remake the mask in order to obtain the desired size or spacing of the fine-opening pattern. However, in accordance with the present invention, the mask-to-workpiece distance can be set and controlled so as to change the amount of expansion of the exposure mask in accordance with the state of the mask. By doing so, the production error related to the fine openings of the exposure mask can be corrected. Thus, in accordance with the present invention, the size or spacing of the fine-opening pattern can be changed without the necessity of correcting or remaking the exposure mask.

Furthermore, the expansion of the exposure mask may change in accordance with the stiffness or film thickness of the mask base material. Also, when plural exposure masks are used to perform superposed pattern exposures, individual exposure masks may have an error in size. In these cases, due to a production error in a process other than the exposure process, a desired size or spacing of the fine-opening pattern would not be obtainable. Even in such cases, however, in accordance with the present invention, the mask-to-workpiece distance can be set and controlled in relation to each exposure mask and, by doing so, the pattern overlay precision can be improved significantly.

Thus, by controlling the clearance between the exposure mask and the workpiece to be exposed, to produce various mask flexure amounts as desired, the size or spacing of the pattern to be transferred to the workpiece can be adjusted and corrected to various values as desired.

On the other hand, there may be a case wherein, when an exposure mask is flexed and brought into intimate contact with a workpiece to be exposed, and if positions of alignment marks provided at opposite sides of a region where an opening pattern of the exposure mask is formed are measured, from the measurement results, it is detected that the opening pattern is 1.001 times larger than a desired pattern.

Even in such a case, the exposure mask may be once disengaged from the workpiece and, when it is going to be intimately contacted to the workpiece again, the exposure mask and the workpiece may be approximated to each other up to a distance with which, upon the workpiece, the opening pattern becomes just 1.000 times according to calculations, and thereafter, the exposure mask may be elastically deformed to be closely contacted to the workpiece. Then, the exposure process may be carried out in the state assuring the right size of the opening pattern. In this manner, the magnification adjustment for the opening pattern of the exposure in the exposure process mask can be accomplished.

Furthermore, the exposure mask and the workpiece to be exposed, to be placed in parallel to each other, may be tilted relative to each other, so as to perform anisotropic magnification correction along the mask surface. With this correction, a pattern disposed in a rectangular shape can be corrected into a trapezoidal shape, for example.

Furthermore, there may be a case where the magnification is different, depending upon dispersion of the physical property of the material of a substrate (workpiece to be exposed) onto which a resist is applied. As an example, when a diffraction grating is going to be produced in a waveguide device, for each substrate, the refractive index of the substrate material that constitutes the waveguide may be dispersive. In such a case, the magnification may be controlled in accordance with the actual refractive index to change the pitch of the diffraction grating, and by doing so, a diffraction grating having a pitch according to the refractive index can be produced.

The present invention can be used in many varieties of applications other than these. However, the present invention is not limited to these applications. The present invention is usable in any case wherein, by setting and controlling the mask-to-workpiece distance, the amount of mask expansion is controlled, and the size of spacing of the pattern to be transferred is controlled thereby.

While the invention has been described with reference to the structures disclosed herein, it is not confined to the details set forth and this application is intended to cover such modifications or changes as may come within the purposes of the improvements or the scope of the following claims.

The invention claimed is:

1. An exposure method, wherein for exposure, an exposure mask having an elastically deformable holding member and a light blocking film, provided on the holding member and being formed with an opening pattern, is flexed to be brought into contact with an object to be exposed, said method comprising the steps of:
    detecting a first distance between the exposure mask and the object to be exposed, before the exposure;
    bringing the exposure mask into contact with the object and detecting a deformation value of the opening pattern of the mask;
    disengaging the exposure mask from the object and bringing the exposure mask close to the object up to a second distance from the object, so as to compensate for the deformation value; and
    exposing the object with the exposure mask using light from a light source.

* * * * *